(12) United States Patent
Brabec et al.

(10) Patent No.: US 7,868,405 B2
(45) Date of Patent: Jan. 11, 2011

(54) INEXPENSIVE ORGANIC SOLAR CELL AND METHOD OF PRODUCING SAME

(75) Inventors: Christoph Brabec, Linz (AT); Pavel Schilinsky, Nürnberg (DE); Christoph Waldauf, Innsbruck (AT)

(73) Assignee: Konarka Technologies, Inc., Lowell, MA (US)

( * ) Notice: Subject to any disclaimer, the term of this patent is extended or adjusted under 35 U.S.C. 154(b) by 442 days.

(21) Appl. No.: 11/940,534

(22) Filed: Nov. 15, 2007

(65) Prior Publication Data

US 2008/0060697 A1    Mar. 13, 2008

Related U.S. Application Data

(63) Continuation of application No. 11/185,193, filed on Jul. 20, 2005, now Pat. No. 7,304,361.

(30) Foreign Application Priority Data

Jul. 29, 2004   (DE) .................. 10 2004 036 734

(51) Int. Cl.
    *H01L 31/101* (2006.01)
(52) U.S. Cl. ............ 257/431; 257/40; 257/E51.012; 257/E31.054

(58) Field of Classification Search .............. 257/40, 257/431, E51.012, E31.054
See application file for complete search history.

(56) References Cited

U.S. PATENT DOCUMENTS

| 3,935,031 | A | | 1/1976 | Adler | |
|---|---|---|---|---|---|
| 5,945,709 | A | * | 8/1999 | Williams et al. | 257/343 |
| 6,232,656 | B1 | * | 5/2001 | Yabu et al. | 257/690 |
| 6,342,411 | B1 | * | 1/2002 | Pitts, Jr. | 438/173 |
| 6,503,375 | B1 | * | 1/2003 | Maydan et al. | 204/242 |
| 6,569,697 | B2 | * | 5/2003 | Lu et al. | 438/22 |
| 6,838,748 | B2 | * | 1/2005 | Ishio et al. | 257/659 |
| 2003/0044587 | A1 | * | 3/2003 | Lu et al. | 428/209 |

FOREIGN PATENT DOCUMENTS

| WO | 02/084758 | 10/2002 |
|---|---|---|
| WO | 03/083960 | 10/2003 |

* cited by examiner

*Primary Examiner*—Victor Mandala
(74) *Attorney, Agent, or Firm*—Fish & Richardson P.C.

(57) ABSTRACT

The present invention proposes an organic photovoltaic component, particularly an organic solar cell, whose electrode is implemented as unstructured and is provided with a passivation layer, so that the passivated electrode layer acts functionally as a structured electrode or electrode layer.

33 Claims, 1 Drawing Sheet

2 Bottom electrode

1 Substrate

3a Conduction land   3b Conduction land

Figure 1:
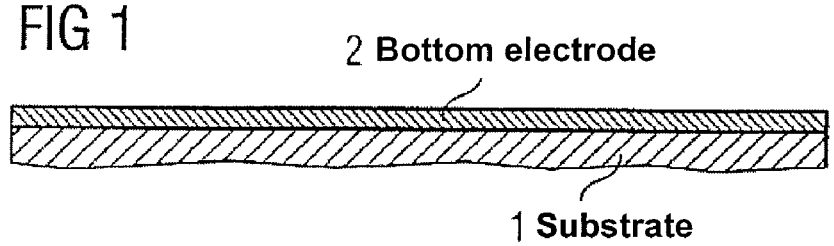

4a Passivation   4b Passivation   4c Passivation   4d Passivation

5 Semiconductor

10 Contact   6 Top electrode   20 Contact

INEXPENSIVE ORGANIC SOLAR CELL AND METHOD OF PRODUCING SAME

CROSS-REFERENCE TO RELATED APPLICATION

This application is a continuation of patent application Ser. No. 11/185,193, filed on Jul. 20, 2005, now U.S. Patent No. 7,304,361, which is incorporated herein by reference in its entirety.

The present invention concerns the field of organic semiconductor components. In particular, the present invention concerns the field of photovoltaics, including photovoltaics based on organic components.

Photovoltaics, particularly in the form of the so-called solar cell, provides a noise-free and emission-free method of producing electrical energy. For many years, a stumbling block to the broad dissemination of photovoltaic systems for generating electricity has been their high production cost, particularly in the case of so-called first-generation photovoltaic systems. First-generation photovoltaic systems or solar cells are based on crystalline silicon wafers, which are complex and therefore expensive to manufacture and process. Typical first-generation photovoltaic systems reached efficiencies of about 15%. The second generation, so-called thin-film solar cells, use semiconductor layers a few microns thick and are therefore cheaper to manufacture than the first-generation cells. However, second-generation photovoltaic systems have yet to match the efficiency of the first generation, instead exhibiting efficiencies in the 3% to 7% range.

In addition to production cost and efficiency, the mechanical properties of photovoltaic systems are of interest in opening up as many fields of application as possible for their use. The first- and second-generation systems have to be mounted on a substantially mechanically rigid substrate, usually glass. The third-generation systems currently in development address this problem. The third-generation systems are very low-weight and can be mounted on a mechanically flexible substrate, thus opening up new and promising fields of application. Polymer films, in particular, are used as substrates in these systems. Another factor that may help to minimize the production cost of the third-generation systems would be for them to become competitive in terms of output and energy cost with the power supplies now in use.

The heretofore-known production methods for solar cells and solar cell modules, particularly organic solar cells and solar cell modules, are subject to numerous constraints that lead to onerous and cost-intensive methods of fabrication, as well as fundamental physical and circuitry-related disadvantages.

Indium/tin oxide (ITO) electrodes have typically been used heretofore, and also serve as the substrate in organic solar cells. Indium/tin oxide (ITO) electrodes are expensive, and their electrical conductivity is low in comparison to other standard conductors such as metallic conductors, for example, a fact that can be a disadvantage particularly in the realization of large-area organic solar cells; and the processing of indium/tin oxide (ITO) electrodes, particularly their structuring, can be done only by means of wet chemical etching processes.

One object of the present invention is, therefore, to provide an alternative to the customary structuring of the electrodes that both is inexpensive to perform and affords a multiplicity of choices for the material of the electrode. Inexpensive substrates are of particular interest.

A further object of the present invention is to increase the electrical conductivity of the electrodes so that alternative materials of lower electrical conductivity can be used.

A further object of the present invention is additionally to enable the electrodes to be structured in such a way that both parallel and series interconnection of individual organic solar cell modules is feasible.

The object of the invention is achieved by means of the inventive subject matter defined by a passivated electrode or electrode layer in Claim 1 and Claim 13.

Provided according to the invention is an organic photovoltaic component, particularly an organic solar cell, whose electrode is implemented as unstructured and is provided with a passivation layer in such a way that the result, functionally, is a structured electrode.

The passivation layer is preferably selectively implemented. In particular, the selective passivation layer can cover the electrode regionally and/or have varying layer thicknesses. The passivation layer advantageously has a layer thickness in a range of 100 nm to a few tens of microns. The passivation layer is preferably a dielectric.

According to one embodiment, the electrode is provided with additional conduction paths to increase the electrical conductivity of the electrode. The conduction paths are advantageously also covered by the passivation layer.

According to a further embodiment, the electrode simultaneously serves as the substrate.

According to a further embodiment, individual regions of the photovoltaic component, particularly of the organic solar cell, are interconnected in circuit in an edge region. This interconnection is advantageously done in series or in parallel. The individual regions are preferably produced by mechanical structuring.

According to the invention, a method is provided for producing an organic photovoltaic component, particularly an organic solar cell. To begin with, an unstructured electrode layer is provided. Next, a passivation layer is deposited on the unstructured electrode layer to produce a passivated electrode layer that substantially corresponds in its functional nature to a structured electrode layer.

Figure 2:
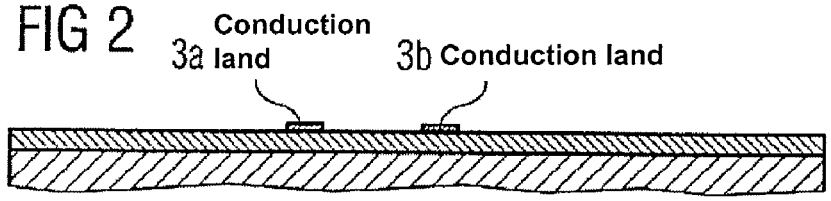
Figure 3:
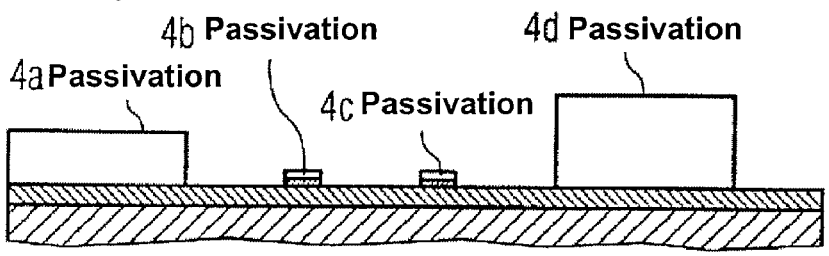
Figure 4:
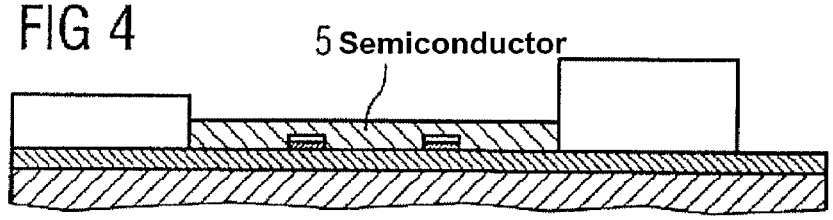
Figure 5:
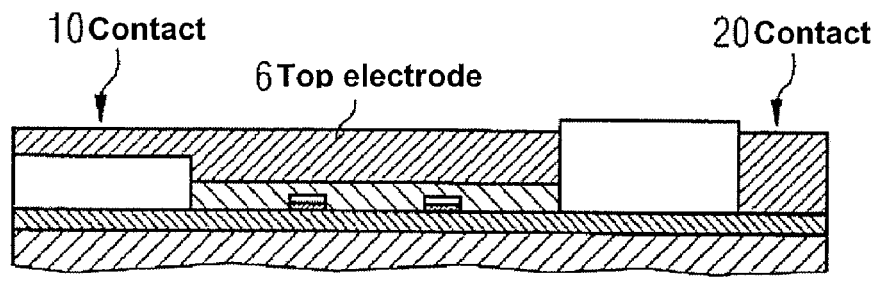

Details and preferred embodiments of the inventive subject matter will emerge from the dependent claims and the drawings, with reference to which exemplary embodiments are explained in detail below to make the inventive subject matter clearly apparent. In the drawings:

FIG. 1 is a sectional view of an unstructured electrode layer (bottom electrode) applied to a substrate, according to one embodiment of the invention;

FIG. 2, in continuation of FIG. 1, additionally shows conduction lands applied to the electrode according to the embodiment of the invention;

FIG. 3, in continuation of FIG. 2, shows selectively passivated regions of the unstructured electrode and the conduction lands by means of passivation [sic] according to the embodiment of the invention;

FIG. 4, in continuation of FIG. 3, shows a semiconductor layer applied in structured form according to the embodiment of the invention; and FIG. 5, in continuation of FIG. 4, shows an electrode layer (top electrode) applied in structured form according to the embodiment of the invention.

FIGS. 1 to 5 show, by way of example, the sequence of steps involved in layer application during the production process of an organic solar cell serving as an exemplary embodiment of the present invention.

Organic components, particularly organic semiconductor components, are generally defined by the fact that at least one functional unit is at least partly organic in nature. With reference to organic semiconductor components, it is to be understood correlatively that one at least one [sic] of the functional layers, such as, for example, the substrate, bottom electrode layer, semiconductor layer, top electrode layer, through contacts, conduction path elements, etc., is composed at least predominantly of an organic material. Candidate organic materials, particularly polymeric materials, will be identified in the course of the following detailed description of the embodiments of the invention. It should be understood, however, that the present invention is not limited to the organic materials and any inorganic materials listed below.

The term "organic materials" should be understood to mean any types of organic, metalorganic and/or inorganic synthetic materials with the exception of classic semiconductor materials based on germanium, silicon, and so on. Further, the term "organic material" also is not intended to be limited to carbon-containing material, but rather, materials such as silicone are also possibilities. Furthermore, in addition to polymeric and oligomeric materials, "small molecules" can likewise be used.

Turning now to FIG. 1, applied to a substrate 1 is a first electrode layer, which will be referred to hereinafter as the bottom electrode layer.

The substrate 1, which serves as a carrier for the organic solar cell described as an exemplary embodiment, is preferably formed of a flexible material, i.e. a mechanically flexible material. For example, thin glass plates and polymer films can be considered for this purpose. In the area of polymer or synthetic films, for example polyethylene terephthalate, polyimide and polyester films are also used. The thickness of the substrate basically determines the overall thickness of the component, since the layer thickness or layer heights of the functional layers applied to substrate 1 are orders of magnitude smaller. The thickness of substrate 1 is typically in the range of 0.05 to 0.5 mm. The substrate thickness can naturally be above or below the foregoing range, depending on the area of application. Specifically, the use of large substrate thicknesses is advisable in cases where the organic components, circuits or systems in question must be resistant to mechanical stress.

The bottom electrode layer 2 is applied unstructured to substrate 1. The electrode layer can be made from a wide variety of materials, i.e., both organic and metallic materials can be contemplated, depending on the choice of production process and the demands placed on the electrode layer. One might particularly mention in this connection indium/tin oxide (ITO), doped polyethylene (PEDOT), polyaniline (PANI), silver (Ag), gold (Au) and other inert metals, organic semiconductors, nanoparticulate solutions (for example indium/tin oxide (ITO) nanoparticles, zinc oxide (ZnO) nanoparticles, etc. This list should not be considered definitive.

Conventionally, to make an organic solar cell it is necessary to structure the bottom electrode layer 2 so that the organic solar cell can function. This structuring is done by selectively ablating the bottom electrode layer 2 in predefined regions. Structuring of this kind is typically done by wet chemical etching, which is a cumbersome process that usually requires handling highly reactive and environmentally undesirable chemicals.

The concept of the present invention provides for no structuring of the bottom electrode layer. Instead of structuring the bottom electrode, i.e. ablating the conductive material from the areas where it is not wanted, it is proposed according to the invention to passivate the conductive material. The term "passivation" as used herein is understood to mean that an additive insulating layer is applied to the electrode layer, i.e. in this case bottom electrode layer 2, thus resulting in masking with respect to the layer next applied to the bottom electrode layer. The passivation is done selectively, i.e., in/on predefined regions of the electrode layer and with individually tailored layer thicknesses for each of the predefined regions masked by a passivation layer. The passivation layer is advantageously applied from solution, particularly by low-cost printing or coating methods. The layer thickness of the passivation layer can be adjusted individually and can range, for example, from a few 100 nm (nanometers) to as much as a few tens of microns (µm).

One functionally critical factor is the electrically insulating property of the passivation layer with respect to an electrically conductive layer applied thereto, i.e. an electrode layer, for example a top electrode layer. A suitable dielectric is therefore used as the material of the passivation layer. The dielectric can, for example, be inorganic or organic, and thus polymeric, in nature.

The inventively proposed passivation has still further advantages over the conventionally provided structured electrode layer.

Non-planarities, unevennesses in the electrode layer that might cause short circuits, can also be deliberately masked. This makes it possible, in an improvement, to apply to the electrode layer electrically conductive lands, as well as more complexly structured conductor arrangements, such as lattice-shaped conductor arrangements, for example, made of highly conductive material, as illustrated in FIG. 2 by the example of two conduction lands 3a and 3b. Structures of this kind, composed of conduction lands applied to an electrode layer, sharply improve the overall conductivity of the electrode layer, here bottom electrode layer 2. These conductive lands, which can have layer heights ranging from a few tens of nanometers to a few or more microns, can be either vapor-deposited, i.e. by physical gas phase deposition of, for example, silver (Ag) or copper (Cu), or printed on, i.e. by means of, for example, a screen printing process employing silver (Ag) screen printing paste.

Since these paths are subsequently passivated by means of an insulating later, i.e. the passivation layer, they can be produced in a largely arbitrary height or layer thickness, for example in a range of a few tens of nanometers to a few tens of microns.

Illustrated by way of example in FIG. 4 is the selectively passivated bottom electrode layer 2 with conduction lands 3a and 3b. In keeping with its selectivity, the structured passivation layer arranged on bottom electrode layer 2 is composed of individual passivation structures or passivation regions 4a to 4d, which are disposed in individual regions on the bottom electrode layer and each have their own layer thicknesses or layer heights. Conduction lands 3a and 3b with passivation structures 4b and 4c have smaller layer thicknesses than passivation structures 4a and 4d, which in this case are intended, by way of example, for the provision or production of contacts (see FIG. 5 and the following description).

Care should be taken to ensure that the edges or the configuration of a printed passivation layer do not lead to the separation, due to the mushroom effect, of an electrode layer disposed above the passivation layer, such as, for example, the top electrode layer.

To summarize, it can be noted ab initio that the inventively proposed unstructured electrode layer with selective passivation is the functional equivalent of a structured electrode layer. The production process for such an unstructured electrode layer with selective passivation is advantageous over the production process for a structured electrode layer. The selective passivation also has additional advantages, particularly both those described in the foregoing and those described below.

Referring to FIG. 4, a semiconductor layer 5 at least partially covering bottom electrode layer 2 will now be described. Semiconductor layer 5 also covers passivated conduction lands 3a and 3b. This means that the total layer height of conduction lands 3a, 3b and the passivation layer applied thereto (passivation structures 4b and 4c) is implemented in this case, by way of example, in such a way that this total layer height is smaller than the layer thickness of semiconductor layer 5. As a result, conduction lands 3a and 3b with their associated passivation layers are completely embedded in semiconductor layer 5.

Exemplarily illustrated semiconductor layer 5 covers in particular a region of bottom electrode layer 2 that is bounded by passivation structures 4a and 4d of the passivation layer applied to bottom electrode layer 2.

Semiconductor layer 5 can be implemented as either an inorganic or, preferably, an organic semiconductor layer. Known organic semiconductor layers are composed, for example, of polythiophenes, polyalkylthiophene, polydihexylterthiophene (PDHTT), polythienylene vinylenes, polyfluorene derivatives, or conjugated polymers, merely to mention a non-limiting selection of candidate organic materials. The semiconductor layer 5 can typically be processed from solution by spin coating, doctor blading or printing.

FIG. 5, finally, shows the organic solar cell according to the inventive embodiment with, covering semiconductor layer 5, an electrode layer that will be designated hereinafter as top electrode 6 owing to its arrangement relative to substrate 1. The electrode layer can be made of an extremely wide variety of materials, i.e. both organic and metallic materials can be contemplated, depending on the choice of production process and the demands placed on the electrode layer. For the sake of completeness, the foregoing examples may be consulted for candidate exemplary materials listed with reference to the bottom electrode layer.

Top electrode layer 6 is implemented in the illustrated exemplary embodiment in such a way that passivation structure 4a of the passivation layer, which is not covered by semiconductor layer 5, is at least partially covered by top electrode layer 6. Contrastingly, passivation structure 4d of the passivation layer, which also is not covered by semiconductor layer 5, is not covered by top electrode layer 6 as well. By means of passivation structure 4d, which is suitable for use as an isolating element with respect to top electrode layer 6 in the plane of that layer, a contact 20 can be realized that is connected to bottom electrode layer 2 and is insulated with respect to the top electrode layer. A vertical contact element to bottom electrode layer 2 can be made, for example, from the electrically conductive material of which top electrode layer 6 is composed. Such a vertical contact element for contact 20 can be produced simultaneously with the application of top electrode layer 6.

A corresponding contact 10 that connects to top electrode layer 6 is advantageously realized in a region of top electrode layer 6 in which top electrode layer 6 covers passivation structure 4a. As described above, passivation structure 4a isolates electrode layers 2 and 6 from each other electrically.

With reference to multi-part, modular organic photovoltaic components/organic solar cells, based on the inventive concept a structuring of the electrodes that is advantageously easy to produce can be chosen for the module wiring.

To obtain individual active regions on substrate 1 that can be interconnected in series, it is necessary to divide bottom electrode layer 2. With parallel interconnection, such division is not necessary. Division of this kind is conventionally performed by wet lithographic processes. In connection with the proposed inventive concept, the division of the electrode layer can advantageously be effected by mechanical structuring. Two processes in particular are suitable for this mechanical structuring: (i) laser structuring and (ii) mechanical scribing or cutting. Since these divided regions are subsequently repassivated by the passivation layer (dielectric) and any edges will be covered, no special care or precision need be devoted to the quality of the division.

In contrast to inorganic solar cells, which are conventionally coupled to modules in series by Z-connection, further according to the invention an advantageously simpler wiring scheme is proposed that, in particular, places fewer demands on precision of production. In the production of organic solar cells by means of coating processes, the edge region can be kept free of printed layers without any difficulty. Only slight (or very slight) demands are placed on printing resolution in such cases. The interconnection can be done in this edge region during the application of the top electrode layer, which is, for example, deposited or printed from the gas phase. Since the remaining electrode regions are passivated by the dielectric, only slight (or minimal) demands need be placed on precision.

The following embodiments can be realized by means of the above-described passivation of bottom electrode layer 2.

The first embodiment of an organic solar cell is illustrated in detail in FIG. 5. This embodiment of the organic solar cell comprises additional conduction lands, illustrated by way of example in the form of conduction lands 3a and 3b, which are also passivated, i.e., covered with the applied passivation layer.

A second implementation of an organic solar cell is essentially the same as the embodiment depicted in FIG. 5. This embodiment of the organic solar cell is provided with a passivated bottom electrode layer but has no additional conduction lands, i.e., the conduction lands illustrated by way of example in FIG. 5 in the form of conduction lands 3a and 3b are not present in this embodiment.

A third implementation of an organic solar cell also comprises a passivated bottom electrode layer, which can be provided either with or without passivated conduction lands. The individual elements of the organic solar cell are connected in parallel. The bottom electrode layer can therefore be implemented over a broad area or implemented in structured form, divided into individual regions. The individual regions can be formed by the above-described mechanical structuring method.

A fourth embodiment of an organic solar cell again provides a passivated bottom electrode layer that also can be provided either with or without passivated conduction lands. The individual elements of the organic solar cell are preferably connected in series in this case. The bottom electrode layer is consequently divided into individual regions over a broad area. The individual regions can be formed by the above-described mechanical structuring method.

A fifth embodiment of an organic solar cell essentially provides one of the above-described embodiments, in which the interconnection in circuit of the individual elements takes place in the non-printed edge region of the elements.

In the context of a sixth embodiment of an organic solar cell, proposed according to invention is a metallic substrate 1 that has electrical conduction properties and can therefore simultaneously serve as a bottom electrode layer. Said metallic substrate 1 can, for example, be a metal foil, a steel sheet, a film provided with a thin metal layer, etc. The film, particularly an organic film such as a polymer film, for example, could be provided with the thin metal layer for example by vapor deposition of copper (Cu), for example. Such metallized films are known, for example, in the field of flexible printed circuit boards.

The invention claimed is:

1. An article, comprising:
a first electrode in the form of a layer having a surface and a plurality of individual regions;
a first passivation structure on a first portion of the surface of the first electrode; and
a second electrode disposed on a second portion of the surface of the first electrode, wherein the second electrode is not disposed on the first portion of the first electrode, and the first portion of the surface of the first electrode is different from the second portion of the surface of the first electrode;
wherein the individual regions are produced by laser structuring and the article is an organic photovoltaic component.

2. The article of claim 1, wherein the individual regions of the photovoltaic component are interconnected in circuit, the interconnection in circuit being located in an edge region.

3. The article of claim 2, wherein the interconnection in circuit is in series or in parallel.

4. The article of claim 1, wherein the first passivation structure has a thickness of at least 100 nm.

5. The article of claim 1, wherein the first passivation structure is a dielectric.

6. The article of claim 1, wherein the first electrode is provided with additional conduction paths to increase the electrical conductivity of the first electrode.

7. The article of claim 6, wherein the additional conduction paths are covered by additional, corresponding, passivation structures.

8. The article of claim 1, wherein the first electrode simultaneously serves as a substrate.

9. The article of claim 1, further comprising a first semiconductor between the first and second electrodes.

10. The article of claim 9, wherein the first semiconductor comprises at least one material selected from the group consisting of polythiophenes, polyalkylthiophene, polydihexylterthiophene, polythienylene vinylenes, and polyfluorene derivatives.

11. The article of claim 9, wherein the first semiconductor comprises a conjugated polymer.

12. The article of claim 1, further comprising a first contact in electrical communication with the first electrode.

13. The article of claim 12, wherein the first passivation structure electrically insulates the first contact from the second electrode.

14. The article of claim 1, further comprising a second passivation structure.

15. The article of claim 14, further comprising a second contact in electrical communication with the second electrode.

16. The article of claim 15, wherein the second passivation structure electrically insulates the second contact from first electrode.

17. The article of claim 1, further comprising a second semiconductor on the second portion of the surface of the first electrode.

18. An article, comprising:
a first electrode in the form of a layer having a surface and a plurality of individual regions;
a first passivation structure on a first portion of the surface of the first electrode;
a second electrode disposed on a second portion of the surface of the first electrode, the second electrode being not disposed on the first portion of the first electrode and the first portion of the surface of the first electrode being different from the second portion of the surface of the first electrode; and
a first semiconductor between the first and second electrodes;
wherein the individual regions are produced by mechanical structuring and the article is an organic photovoltaic component.

19. The article of claim 18, wherein the individual regions of the photovoltaic component are interconnected in circuit, the interconnection in circuit being located in an edge region.

20. The article of claim 19, wherein the interconnection in circuit is in series or in parallel.

21. The article of claim 18, wherein the first passivation structure has a thickness of at least 100 nm.

22. The article of claim 18, wherein the first passivation structure is a dielectric.

23. The article of claim 18, wherein the first electrode is provided with additional conduction paths to increase the electrical conductivity of the first electrode.

24. The article of claim 23, wherein the additional conduction paths are covered by additional, corresponding, passivation structures.

25. The article of claim 18, wherein the first electrode simultaneously serves as a substrate.

26. The article of claim 18, wherein the first semiconductor comprises at least one material selected from the group consisting of polythiophenes, polyalkylthiophene, polydihexylterthiophene, polythienylene vinylenes, and polyfluorene derivatives.

27. The article of claim 18, wherein the first semiconductor comprises a conjugated polymer.

28. The article of claim 18, further comprising a first contact in electrical communication with the first electrode.

29. The article of claim 28, wherein the first passivation structure electrically insulates the first contact from the second electrode.

30. The article of claim 18, further comprising a second passivation structure.

31. The article of claim 30, further comprising a second contact in electrical communication with the second electrode.

32. The article of claim 31, wherein the second passivation structure electrically insulates the second contact from first electrode.

33. The article of claim 18, further comprising a second semiconductor on the second portion of the surface of the first electrode.

* * * * *